(12) United States Patent
Virgil

(10) Patent No.: US 7,236,020 B1
(45) Date of Patent: Jun. 26, 2007

(54) PULSE TRANSLATION METHOD FROM LOW TO HIGH VOLTAGE LEVEL IN HALF AND FULL BRIDGE APPLICATION

(75) Inventor: Gheorghiu Ioan Virgil, Campbell, CA (US)

(73) Assignee: 02Micro Inc., Santa Clara, CA (US)

( * ) Notice: Subject to any disclaimer, the term of this patent is extended or adjusted under 35 U.S.C. 154(b) by 0 days.

(21) Appl. No.: 11/015,044

(22) Filed: Dec. 17, 2004

(51) Int. Cl.
*H03K 5/12* (2006.01)

(52) U.S. Cl. ...................................... 327/108; 327/112

(58) Field of Classification Search ........ 327/108–112, 327/170
See application file for complete search history.

(56) References Cited

U.S. PATENT DOCUMENTS

| | | | |
|---|---|---|---|
| 5,764,024 A * | 6/1998 | Wilson | 318/805 |
| 6,130,563 A * | 10/2000 | Pilling et al. | 327/111 |
| 6,376,999 B1 * | 4/2002 | Li et al. | 315/307 |
| 6,535,035 B2 * | 3/2003 | Ziemer | 327/108 |
| 6,958,919 B1 * | 10/2005 | Kung | 363/17 |

* cited by examiner

*Primary Examiner*—Dinh T. Le (57) ABSTRACT

A switched bridge circuit comprises a first switch, a second switch, and a non-overlapping pulse generator. The first switch is coupled to a load. The second switch is coupled to said load. The non-overlapping pulse generator is coupled to the first switch and the second switch and coupled to receive an input signal. The non-overlapping pulse generator in response to the input signal generates a first control signal and a second control signal that respectively control the first and second switches. The pulses in the first and second control signals are not overlapped so that the first and second switches are not simultaneously enabled.

12 Claims, 8 Drawing Sheets

PULSE TRANSLATION METHOD FROM LOW TO HIGH VOLTAGE LEVEL IN HALF AND FULL BRIDGE APPLICATION

BACKGROUND OF THE INVENTION

1. Field of the Invention

The present invention relates to driving techniques for supplying power to a load, and more particularly, to driving circuitry in full bridge or half bridge inverter applications having non-overlapping pulses for vertical branches of the bridge, i.e., low voltage channel and high voltage channel.

2. Description of the Related Art

Figure 1A:
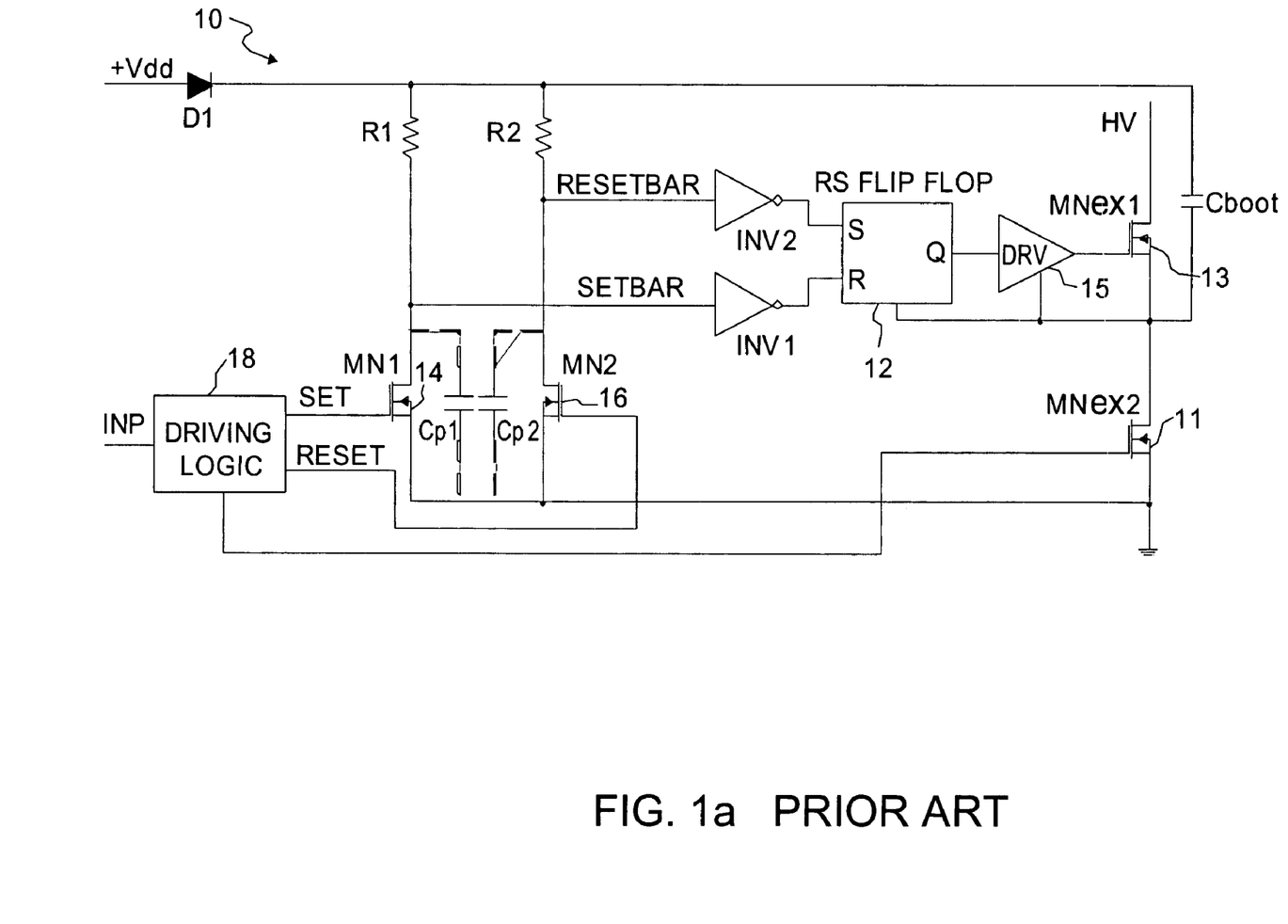
FIG. 1a is a schematic of a typical structure of a level shift stage in prior art.
Figure 1B:
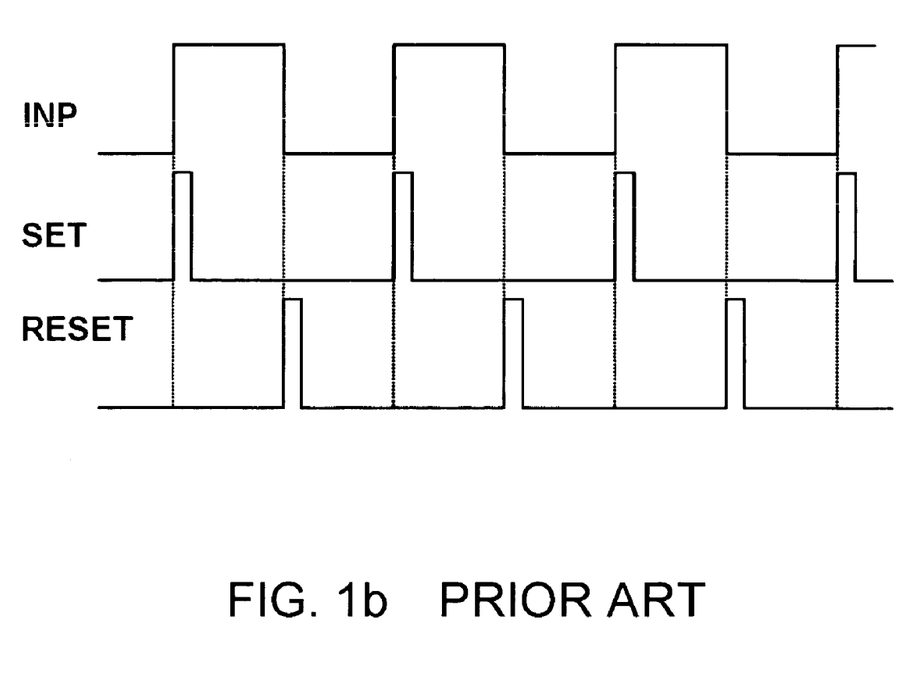

FIG. 1a illustrates a typical structure of level shift stage circuit 10 in the prior art. The level shift stage circuit 10 is provided with two HV DMOS transistors 14 and 16 for providing SET and RESET pulses to a RS flip flop 12. The input pulses applied to the Driving logic block 18 are decomposed into SET and RESET short pulses synchronous to the rising edge and falling edge of input signal. The level shifter, i.e., the transistors 14 and 16 generates two pulses, SETBAR and RESETBAR. These pulses are inverted once and are then applied to the RS flip flop 12. The output Q of the RS flip flop 12 will generate one square wave pulse, which is applied to the external power MOS transistor 13 and via a driver 15. Referring FIG. 1b, it depicts the timing diagram of the input signal, the SET signal, and the RESET signal.

The most important feature in the translation function when driving pulses from low voltage side to high voltage side is that using high voltage MOS/DMOS or BJT (Bipolar Junction Transistor) transistors result in dissipation of power, increase of cost, and occupation of space.

Accordingly, there exists a need for a converter circuit which is able to minimize the number of the transistors and the dissipation of power.

SUMMARY OF THE INVENTION

It is an object of the present invention to provide a half or full bridge circuit with minimized power dissipation.

In order to achieve the above object, the present invention provides a switched bridge circuit which comprises a first switch, a second switch, and a non-overlapping pulse generator. The first switch is coupled to a load. The second switch is coupled to said load. The non-overlapping pulse generator is coupled to the first switch and the second switch and coupled to receive an input signal. The non-overlapping pulse generator in response to the input signal generates a first control signal and a second control signal that respectively control the first and second switches. The pulses in the first and second control signals are not overlapped so that the first and second switches are not simultaneously enabled.

BRIEF DESCRIPTION OF THE DRAWINGS

Other objects, advantages, and novel features of the invention will become more apparent from the following detailed description when taken in conjunction with the accompanying drawing.

FIG. 1b is the timing diagram of the driving logic block of the level shift stage shown in FIG. 1a.

DESCRIPTION OF THE EMBODIMENT

While not wishing to be bound by example, the following Detailed Description will proceed with reference to a CCFL (Cold Cathode Fluorescent Lamp) as the load for the circuit of the present invention. The CCFL may serve as a backlight of a an LCD (liquid crystal display) panel, to illuminate the LCD panel. However, it will be apparent that the present invention is not limited only to driving one or more CCFLs, rather, the present invention should be broadly construed as a power converter circuit and methodology independent of the particular load for a particular application.

Figure 2:
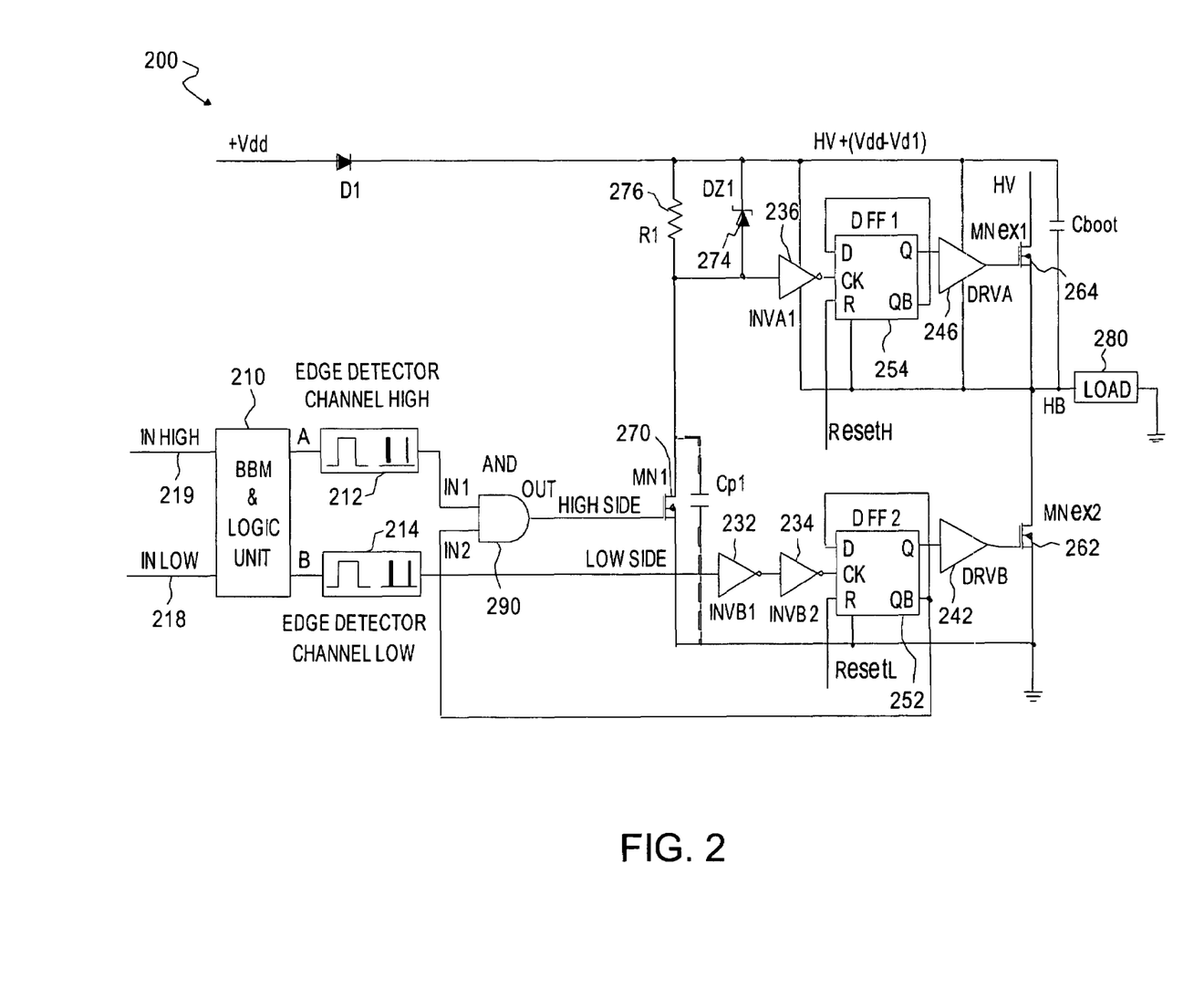
FIG. 2 is a block diagram of a switching control circuit according to one embodiment of the present invention.

Referring to FIG. 2, a half bridge switching control circuit 200 is illustrated according to an embodiment of the present invention. The circuit 200 is connected to a load 280. For example, the load 280 may be a transformer which has a primary wiring and a second wiring. The primary wiring of the transformer is connected to the circuit 200 and the secondary wiring is connected to one or more CCFLs so as to convert a DC power to an AC power and supply the energy to the CCFL.

The circuit 200 includes a logic unit 210 coupled to input terminals 218 and 219. Two edge detectors 212 and 214 are coupled to the logic unit 210 and output signals as control signal A and control signal B. The edge detectors 212 and 214 are coupled to two switches 262 and 264, respectively, and output signals as a high side signal and a low side signal, respectively, for alternatively turning on the two switches 262 and 264.

The two switches 262 and 264 may be N-channel metal oxide semiconductor field effect transistor (MOSFET) gate-controlled switches. The drain of the switch 264 is connected to a voltage source (HV, for example 600 volt), the source of the switch 264 is connected to the drain of the switch 262, and the source of the switch 262 is connected to the ground.

In other embodiments, it will be apparent to those skilled in the art that the switches 262 and 264 may be P-channel metal oxide semiconductor field effect transistor (MOSFET) gate-controlled switches.

Figure 3A:
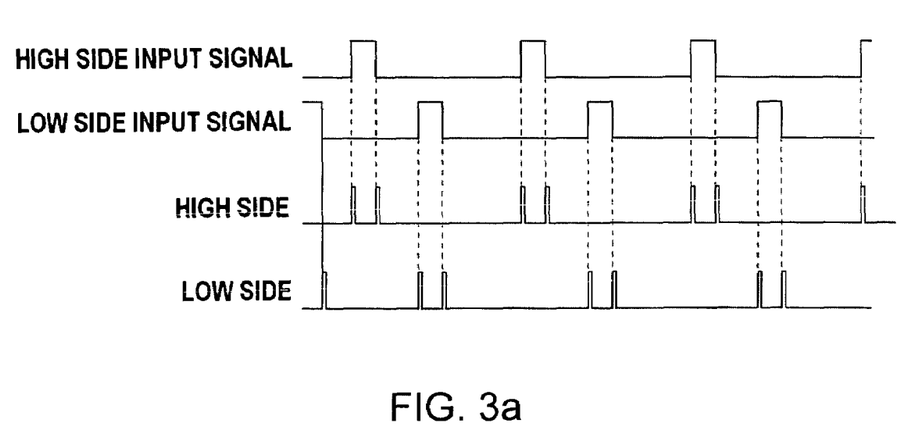
FIG. 3a is a timing diagram of high and low side input signals and high and low side signals in the switching control circuit shown in FIG. 2 according to one embodiment of the present invention.

According to one embodiment of the present invention, the input terminals 218 and 219 introduce two input signals, i.e., a high side input signal and a low side input signal, into the logic unit 210. Referring to FIG. 3a, the waveforms or the timings of the high and low side input signals and the high and low side signals are illustrated in accordance with the embodiment of the invention. The input signals can be pulse width modulation (PWM) signals for respectively control the switch 264 and 262. In this embodiment, the logic unit 210 is used to generate two control signal respectively in accordance with the high and low side input signals.

Figure 3B:
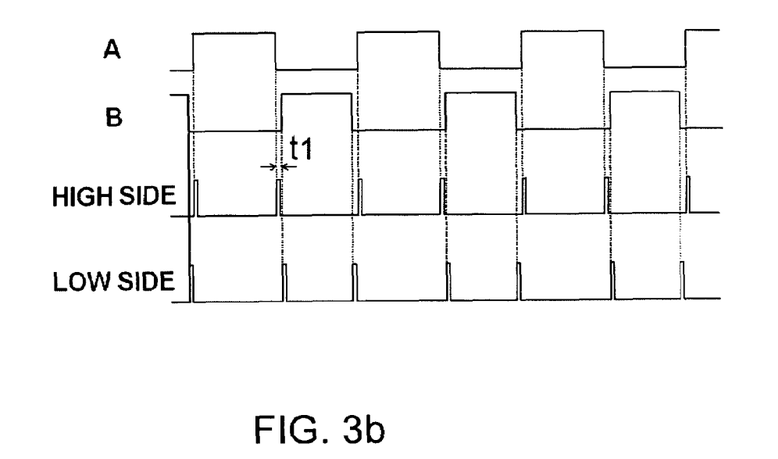
FIG. 3b is a timing diagram of control signals A and B and high and low side signals in the switching control circuit shown in FIG. 2 according to one embodiment of the present invention.

According to another embodiment of the present invention, the input terminal 218 is enabled and the logic unit 210 is served as a non-overlapping pulse generator. Referring to FIG. 3b, the waveforms or the timings of the control signals A and B and the high and low side signals are illustrated in accordance with the embodiment of the invention. The input terminal 218 introduces a square wave into the non-overlapping pulse generator 210 of the circuit 200. According to the input square wave, the non-overlapping pulse generator 210 will generate two output signals, i.e., control signal A and control signal B, shown in the drawing. For example, the positive pluses of the input square wave compose the control signal A, and the negative pluses of the input square wave, or the inverted signal of the input square wave compose the signal B. The control signal A and control signal B have the identical frequency and have substantially inverted waveforms. The pulses of the signals A and B are not overlapped.

The rising edge of signal A is slightly delayed to the falling edge of signal B, and the rising edge of signal B is slightly delayed to falling edge of signal A. The sum of the slight delay between the rising edge of signal A and the falling edge of signal B and the slight delay between the rising edge of signal B and the falling edge of signal A is defined as a non-overlapping time t1.

Figure 4A:
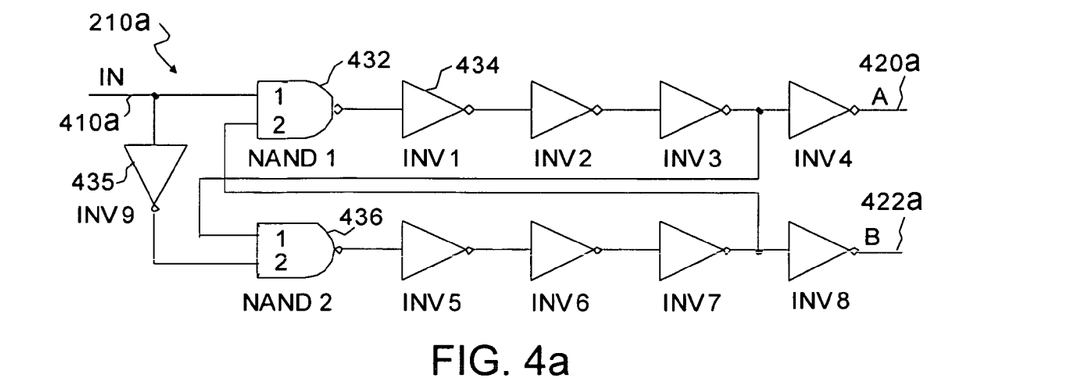
FIG. 4a is a schematic of an exemplary circuit of the non-overlapping pulse generator in the switching control circuit according to one embodiment of the present invention.
Figure 4B:
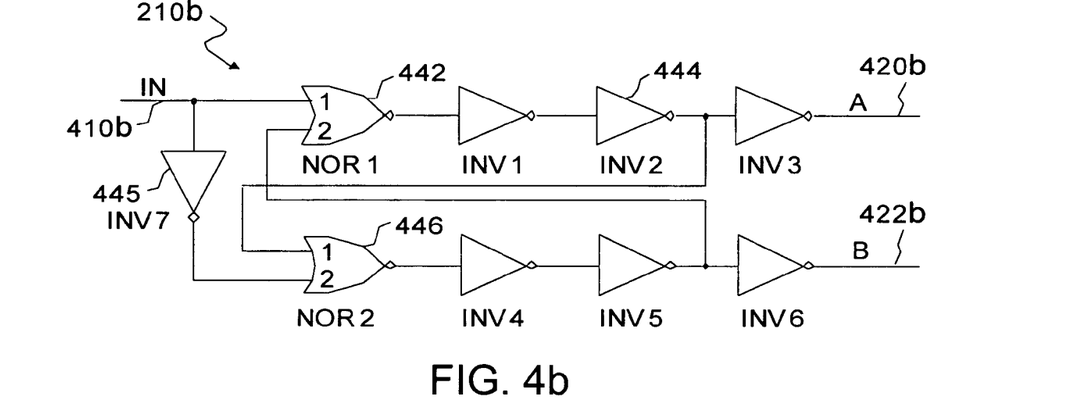
FIG. 4b is a schematic of another exemplary circuit of the non-overlapping pulse generator in the switching control circuit according to one embodiment of the present invention.
Figure 4C:
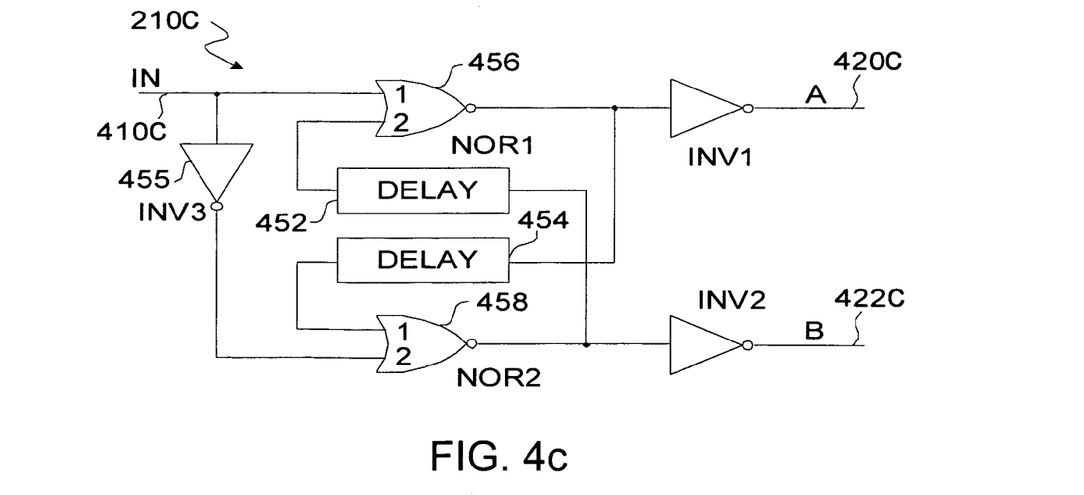
FIG. 4c is a schematic of still another exemplary circuit of the non-overlapping pulse generator in the switching control circuit according to one embodiment of the present invention.

The non-overlapping pulse generator 210 is well known to those skilled in the art. Referring to FIGS. 4a, 4b, 4c, they depict three exemplary non-overlapping pulse generators 210a, 210b, 210c which receive square waves at the input ends 410a, 410b, and 410c, and generate two non-overlapping pulses or signals at the output ends 420a–c and 422a–c in accordance with embodiments of the present invention. The non-overlapping function is also referred to as BBM (break-before-make).

Referring to FIG. 4a, the non-overlapping pulse generator 210a has two NAND gates 432 and 436, an INVERTER gate 435, and a plurality of INVERTER gates 434. The input square waves is inputted at the input end 410a and coupled to the NAND gates 432 and 436. The INVERTER gate 435 is inserted between one of the NAND gates 432 and 436 and the input end 410a. The plurality of INVERTER gates 434 are connected to the output of the NAND gates 432 and 436 to form the delay or the non-overlapping time t1. Two non-overlapped signals, i.e., the control signals A and B, are generated at the output end 420a and 422a. The non-overlapping time t1 can be set or adjusted by the number of the INVERTER gates.

Referring to FIG. 4b, the non-overlapping pulse generator 210b has two NOR gates 442 and 446, an INVERTER gate 445, and a plurality of INVERTER gates 444. The input square waves is inputted at the input end 410b and coupled to the NOR gates 442 and 446. The INVERTER gate 445 is inserted between one of the NOR gates 442 and 446 and the input end 410b. The plurality of INVERTER gates 444 are connected to the output of the NOR gates 442 and 446 to form the delay or the non-overlapping time t1. Two non-overlapped signals, i.e., the control signals A and B, are generated at the output end 420b and 422b. The non-overlapping time can be set or adjusted by the number of the INVERTER gates.

Referring to FIG. 4c, the non-overlapping pulse generator 210c has delay circuits 452 and 454, an INVERTER gate 455, and two NOR gates 458 and 456. The input square waves is inputted at the input end 410c and coupled to the NOR gates 458 and 456. The INVERTER gate 455 is inserted between one of the NOR gates 458 and 456 and the input end 410c. The delay circuits 452 and 454, such as an RC circuit, inserted in the feedback branches of two NOR gates 456 and 458 to form the delay or the non-overlapping time t1. Two non-overlapped signals, i.e., the control signals A and B, are generated at the output end 420c and 422c. The non-overlapping time can be set or adjusted by the delay circuits 452 and 454.

Again referring to FIG. 2, the non-overlapping control signals A and B are input into the edge detectors 212 and 214, respectively. The edge detectors 212 and 214 receive the non-overlapping signals A and B, respectively. The edge detector 212 decomposes the control signal A and generates two pulses corresponding to the rising and falling edges control signal A to define a high side signal. The edge detector 214 generate two pulses corresponding to the rising and falling edges of control signal B to define a low side signal.

Figure 5A:
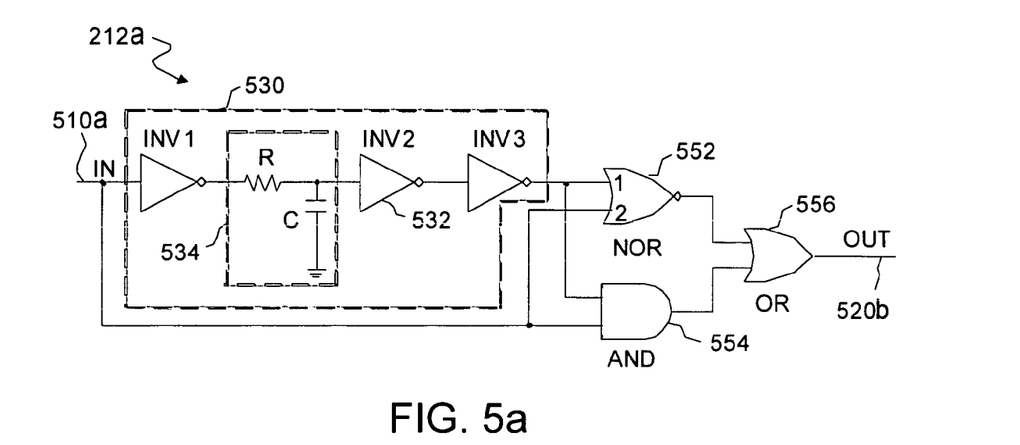
FIG. 5a is a schematic of an exemplary circuit of the edge detector in the switching control circuit.
Figure 5B:
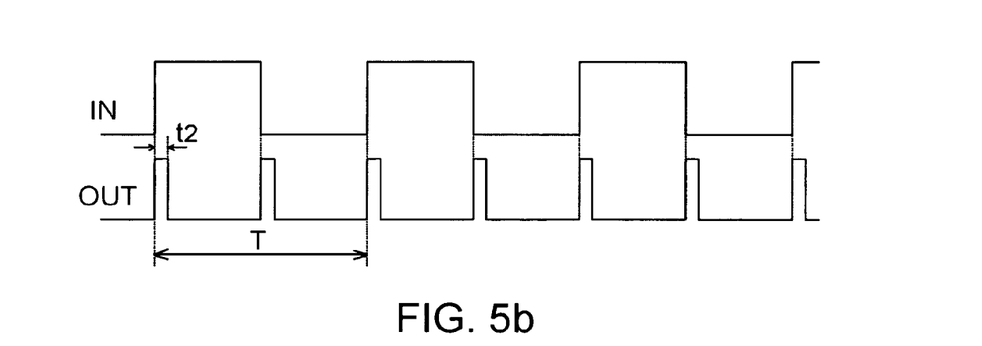
FIG. 5b is a timing diagram of the edge detector shown in FIG. 5a according to one embodiment of the present invention.
Figure 5C:
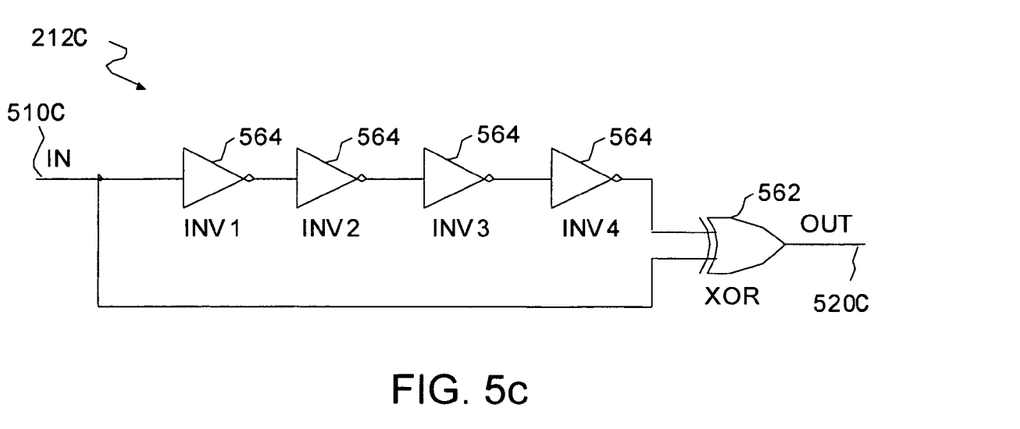
FIG. 5c is a schematic of another exemplary circuit of the edge detector in the switching control circuit according to one embodiment of the present invention.

Referring to FIGS. 5a, and 5c, they depict two exemplary edge detectors 212a and 212c which receive square waves at the input ends 510a and 510c, and generate pulses corresponding to the rising and falling edges of the input square waves at the output ends 520a and 520c in accordance of the embodiments of the present invention.

Referring to FIG. 5a, the edge detector 212a includes a delay circuit 530, an NOR gate 552, an AND gate 554, and an OR gate 556 so as to generate short positive pulses for each rising or falling edge of the input square wave signal, as shown in FIG. 5b. The width t2 of the output pulses of the edge detector 112a can be set or adjusted by the delay circuit 530 which includes RC circuit 534 and INVERTOR gates 532. The amount of the width t2 of the output pulses is proportional to the power dissipation.

Referring to FIG. 5c, the edge detector 212c has an XOR gate 562 to define the positive and negative edge and generate the pulses corresponding to the rising and falling edges of the input square wave. Four INVERTOR gates 564 set or adjust the width t of the output pulses.

Again referring to FIG. 2, the outputs of the edge detectors 212 and 214 are defined as two pulse signals, i.e., the high side signal and the low side signal, respectively. The source of the switch or MOSFET 262 is connected to ground such that a low voltage, for example, 8 or 20 volt, which is input into the gate of the MOSFET 262, is able to enable and disable switch 262. This circuit for the switch 262 is referred to as the lower side of the bridge switch. The source of the switch or MOSFET 264 is connected to the drain of the MOSFET 262 such that a low voltage at the gate of the MOSFET 264 may not reliably enable and disable switch 264, and the voltage of the signal which is input into the gate of the MOSFET 264 has to be higher than the voltage at the source of the MOSFET 264. This circuit for the switch 264 is referred to as the higher side of the bridge switch.

The plurality of output short positive pulses from the edge detector 214, i.e., the low side signal, are applied to a CK end of a D type flip flop 252 via two INVERTOR gates 232 and 234. The D type flip flop 252 is connected in a toggle configuration so as to form a output Q from the short positive pulses. The output Q of the D type flip flop 252 will generate a switch signal which is substantially similar to the signal B from the non-overlapping pulse generator 210. The switch signal is input into the switch 262 via a driver 242 to control the switch 262, e.g., to enable and disable switch 262. That is, the rising edge of the switch signal enables switch 262 and the falling edge of the switch signal disables switch 262.

The plurality of output short positive pulses from the edge detector 212, i.e., the high side signal, are applied to a AND gate 290 and then the gate of a switch or a level shifter, such as a high voltage DMOS transistor 270. Referring to FIG. 2, the output QB of the D type flip flop 252 is the opposite level of the output Q and coupled to one of the input of the AND gate 290. When the output Q of the D type flip flop 252 enables the switch 262, the output QB can keep the output of the AND gate 290 in low level to prevent the switches 262 and 264 from enabling simultaneously.

The drain of DMOS transistor 270 is coupled to a resistor 272 and an INVERTER gate 236. The source of the DMOS transistor 270 is coupled to ground such that the plurality of positive pulses of the high side signal enable the transistor 270 and a plurality of voltage drops or negative pulses are generated between the two ends of the resistor 276. The input of the INVERTER gate 236 is connected to and protected by a zener diodes 274. The output of the INVERTER gate 236 is connected to a CK end of a D type flip-flop 254. The negative pulses at drain of DMOS transistor 270 are input into the INVERTER gate 236 to form a plurality of positive pulses which is similar to the pulses of the channel A but with a higher voltage. The D type flip flop 254 is connected in a toggle configuration so as to form a output from the plurality of short positive pulses. The output Q of the D type flip flop 254 will generate a switch signal which is substantially similar to the control signal A from the non-overlapping pulse generator 210. The switch signal is input into the switch 264 via a driver 246 to turn on and off the switch 264, e.g., to enable and disable switch 264. That is, the rising edge of the switch signal enables switch 264 and the falling edge of the switch signal disables switch 264.

It will be apparent to those skilled in the art that the circuit 200 indicated in the about description is a half bridge DC to AC converter circuit, and can be easily modified to a full bridge DC to AC converter circuit without departing from the scope of the present invention.

Figure 6:
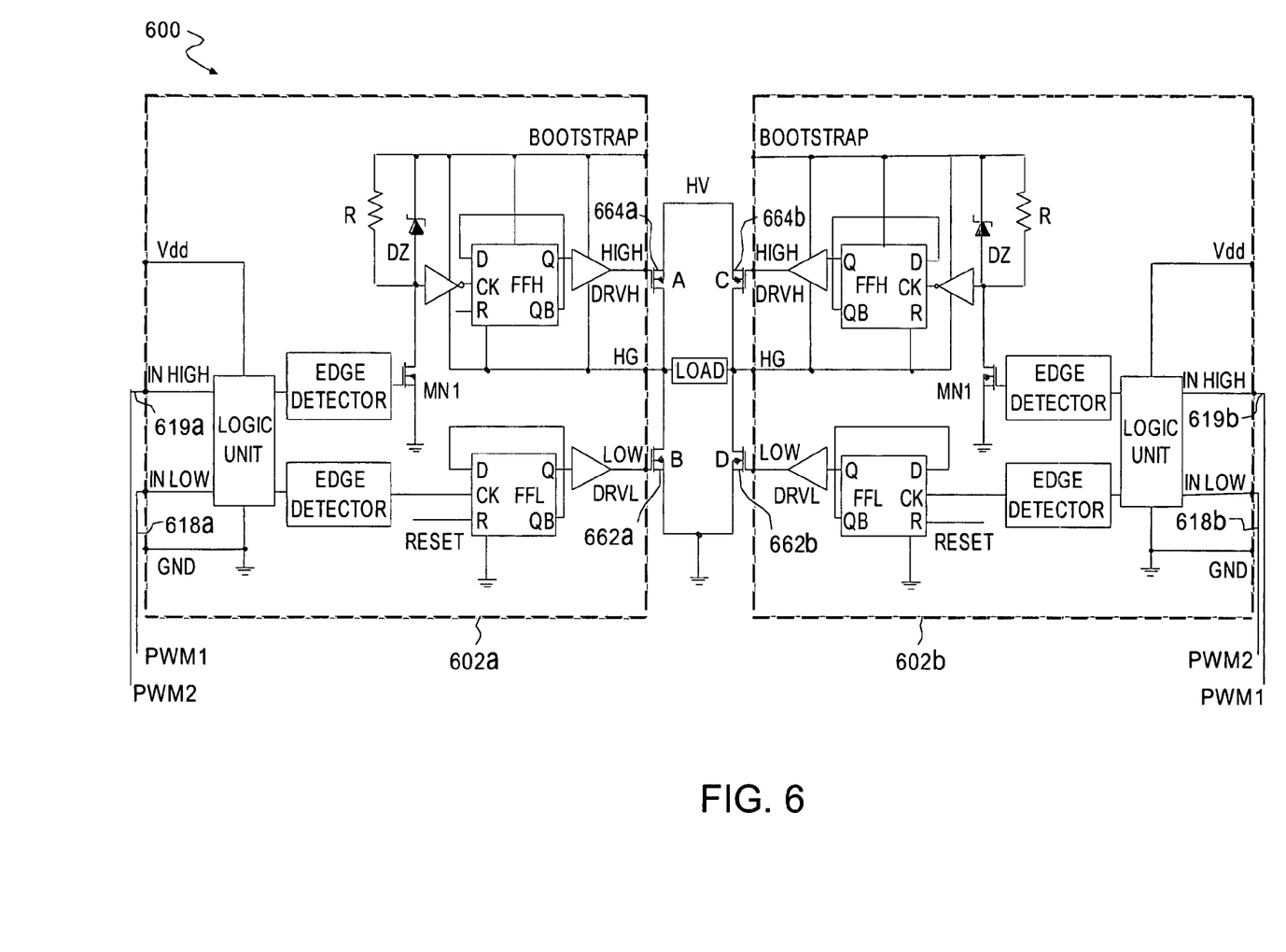
FIG. 6 is a block diagram of a switching control circuit according to one embodiment of the present invention.

Referring to FIG. 6, a full bridge switching control circuit 600 is illustrated according to an embodiment of the present invention. The circuit 600 is generally similar to the circuit 200 wherein similar elements are designated with similar reference numerals. The circuit 600 has two same circuits 602a and 602b. Each one of the circuit 602a and 602b can be formed as an integrate circuit chip and packaged as an integrate circuit, IC. An input signal PWM1 is input into the input terminals 618a and 619b for controlling the switch 662a and 664b, and an input signal PWM2 is input into the input terminals 619a and 618b for controlling the switch 664a and 662b. The operation of the circuits 602a and 602b are similar to the circuit 200. It will be apparent to those skilled in the art that two phase shifted signals with 50% duty cycle pulse can be used as the input signals in place of the input signals PWM1 and PWM2.

Figure 7:
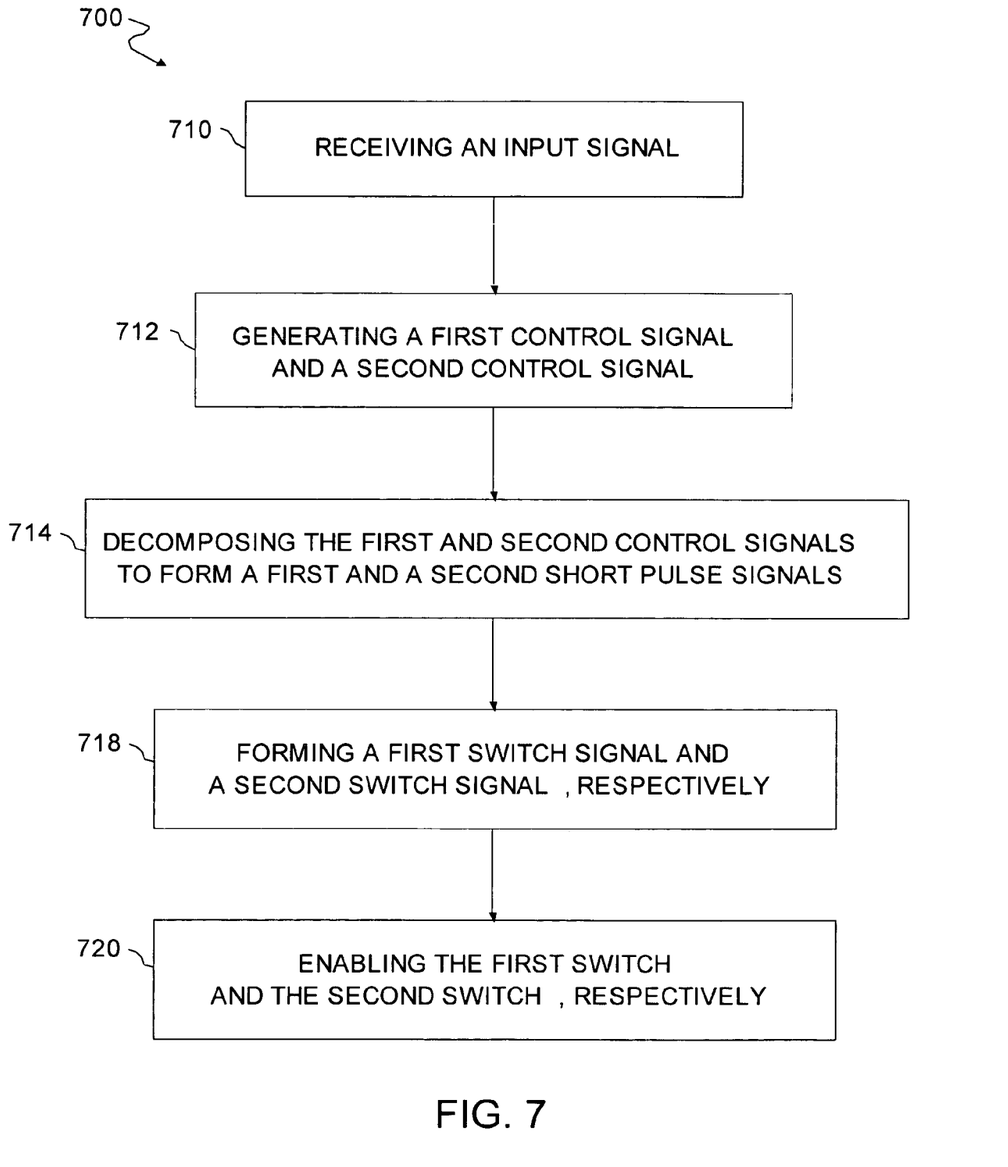
FIG. 7 is a flowchart diagram of a switching control method according to one embodiment of the present invention.

Referring to FIG. 7, a method 700 to alternatively enable and disable a first and second switch in switched bridge circuit is illustrated in accordance of an embodiment of the present invention. In a first step 710 of the method 700, an input signal, such as, a square is received. Then in a step 712, a first control signal and a second control signal are generated in response to the input signal. The pulses in the first control signal and the second control signal do not overlap.

In a step 714, the first control signal and the second control signal are decomposed to form a first short pulse signal and a second short pulses signal. According to an embodiment of the present invention, rising and falling edges of the first control signal and the second control signal are detected to form the first and second short pulse signals. In other words, the first short pulse signal has a plurality of short pulses in response to the rising and the falling edges of the first control signal, and the second short pulse signal has a plurality of short pulses in response to the rising and the falling edges of the second control signal. In one embodiment, one of the first and the second short pulse signals respectively in response to the first and the second control signals is level-shifted.

In a step 718, a first switch signal and a second switch signal is formed in response to the first short pulse signal and second short pulse signal, respectively. The first switch signal and the second switch signal are similar to the first control signal and the second control signal, respectively. According to an embodiment of the present invention, the output state of the first switch signal is changed upon receiving a pulse from the first short pulse signal, and the output state of the second switch signal is changed upon receiving a pulse from the second short pulse signal. In a step 720, the first switch and the second switch is enabled and disabled in response to the first switch signal and the second switch signal, respectively. In other words, the output state of the first switch is changed upon receiving a pulse from the first short pulse signal, and the output state of the second switch is changed upon receiving a pulse from the second short pulse signal.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A switched bridge circuit comprising:
   a first switch coupled to a load;
   a second switch coupled to said load;
   a non-overlapping pulse generator coupled to said first switch and said second switch and coupled to an input signal, wherein said non-overlapping pulse generator in response to said input signal generates a first control signal and a second control signal that respectively control said first and second switches, wherein pulses in said first and second control signals are not overlapped so that said first and second switches are not simultaneously enabled;

a first edge detector coupled to said non-overlapping pulse generator for detecting rising and falling edges of said first control signal to generate a first plurality of pulse signals;

a second edge detector coupled to said non-overlapping pulse generator for detecting rising and falling edges of said second control signal to generate a second plurality of pulse signals;

a first D type flip-flop coupled to said first edge detector and said first switch for forming a first switch signal in response to said first plurality of pulse signals, said first switch signal controlling said first switch; and a second D type flip-flop coupled to said second edge detector and said second switch for forming a second switch signal in response to the second plurality of pulse signals, said second switch signal controlling said second switch.

2. The switched bridge circuit of claim 1, further comprising:

a third switch coupled to said non-overlapping pulse generator for level shifting one of said first control signal and said second control signal.

3. The switched bridge circuit of claim 2, wherein said third switch is a high voltage transistor.

4. The switched bridge circuit of claim 1, wherein said load is a cold cathode fluorescent lamp (CCFL) adapted for illuminating an external liquid crystal panel.

5. The switched bridge circuit of claim 1, wherein said input signal is a square wave.

6. The switched bridge circuit of claim 1, wherein said first and said second plurality of pulse signals are short positive pulses.

7. The switched bridge circuit of claim 1, wherein the switched bridge circuit is a full bridge circuit.

8. The switched bridge circuit of claim 1, wherein the switched bridge circuit is a half bridge circuit.

9. An Integrated Circuit (IC) adapted for controlling a first and second external switches which are coupled to an external load, comprising:

a non-overlapping pulse generator coupled to an input signal, wherein said non-overlapping pulse generator in response to said input signal generates a first control signal and a second control signal, wherein pulses in said first and second control signals are not overlapped;

a first edge detector coupled to said first control signal for detecting rising and falling edges of said first control signal to generate a first plurality of pulse signals;

a first D type flip-flop coupled to said first edge detector and said first switch for forming a first switch signal in response to said first plurality of pulse signals, said first switch signal controlling said first switch;

a second edge detector coupled to said second control signal for detecting rising and falling edges of said second control signal to generate a second plurality of pulse signals, and a second D type flip-flop coupled to said second edge detector and said second switch for forming a second switch signal in response to the second plurality of pulse signals, said second switch signal controlling said second switch.

10. The Integrated Circuit (IC) of claim 9, further comprising:

a third switch coupled to one of the first and second edge detectors for level shifting one of said first plurality of pulse signals and said second plurality of pulse signals.

11. The Integrated Circuit (IC) of claim 9, wherein said input signal is a square wave.

12. The Integrated Circuit (IC) of claim 9, wherein said first and said second plurality of pulse signals are short positive pulses.

* * * * *